United States Patent [19]

Arakawa

[11] Patent Number: 4,682,051

[45] Date of Patent: Jul. 21, 1987

[54] VOLTAGE LEVEL DETECTION CIRCUIT

[75] Inventor: Hideki Arakawa, Yokohama, Japan

[73] Assignee: Fujitsu Limited, Kawasaki, Japan

[21] Appl. No.: 706,284

[22] Filed: Feb. 27, 1985

[30] Foreign Application Priority Data

Feb. 28, 1984 [JP] Japan .................................. 59-35112

[51] Int. Cl.$^4$ ............................................ H03K 17/30
[52] U.S. Cl. ...................................... 307/359; 307/354;
307/581; 307/279; 307/290
[58] Field of Search ................ 307/443, 448, 354, 362,
307/363, 554, 546–548, 568, 581, 279, 592, 594,
605, 358–359, 29 D

[56] References Cited

U.S. PATENT DOCUMENTS

| | | | |
|---|---|---|---|
| 3,950,654 | 4/1976 | Broedner et al. ................ | 307/594 X |
| 4,173,756 | 11/1979 | Kawagai et al. ..................... | 340/636 |
| 4,301,380 | 11/1981 | Thomas ................................ | 307/362 |
| 4,321,489 | 3/1982 | Higuchi et al. ...................... | 307/362 |
| 4,460,985 | 7/1984 | Hoffman .......................... | 307/530 X |
| 4,463,270 | 7/1984 | Gordon ............................ | 307/594 X |

FOREIGN PATENT DOCUMENTS

0035345 9/1981 European Pat. Off. .
2310660 12/1975 France .
57-168525 10/1982 Japan .
2081458 3/1979 United Kingdom .

Primary Examiner—Stanley D. Miller
Assistant Examiner—D. R. Hudspeth
Attorney, Agent, or Firm—Staas & Halsey

[57] ABSTRACT

A voltage level detection circuit connected between first and second feed lines, including a first depletion-type metal insulator semiconductor (MIS) transistor connected between the first feed line and a common node and having a gate connected to the first feed line, a second depletion-type MIS transistor connected between the common node and the second feed line and having a gate connected to the second feed line, and a circuit connected to the common node for generating an output signal when a potential at the common node reaches a predetermined value. The voltage level detection circuit can include a third depletion-type MIS transistor having a drain connected to the drain of the first depletion-type MIS transistor, a source connected to the source of the first depletion-type MIS transistor, and a gate connected to the output terminal of the output signal generation circuit, to output a stabilized output signal at the output terminal of the output signal generation circuit.

12 Claims, 7 Drawing Figures

VOLTAGE LEVEL DETECTION CIRCUIT

BACKGROUND OF THE INVENTION

The present invention relates to a circuit for detecting a voltage level of a direct current (DC) power supply.

In general, a circuit may become operable when a voltage level applied thereto from the DC power supply reaches a predetermined level lower than a rated level. For example, an integrated circuit (IC) having a nominal voltage value of 5 V(DC) may become operable when the voltage value applied thereto exceeds 3 V(DC). To ensure stable operation of the circuit when, for example, the power supply starts to come on, however, a precise voltage value of the power supply, corresponding to when it reaches the predetermined value, must be detected. After detecting the voltage value, the active circuit receives a detection signal and may become operable in response to an external signal.

For low level voltage value detection for, for example, ICs, a number of voltage level detection circuits are known. One example of a prior art voltage level detection circuit consists of two series-connected enhancement-type metal oxide field effect transistors (MOSFETs) provided between a power feed line connected to the power supply having a voltage value to be detected, and a ground. This voltage level detection circuit is advantageous in that it has a simple circuit construction and a simple manufacturing process. On the other hand, this voltage level detection circuit demands a large power consumption in itself and has a questionable accuracy in voltage value detection.

Another prior art voltage level detection circuit consists of series-connected enhancement-type and depletion-type MOSFETs (e.g., Japanese Unexamined Patent Publication (Kokai) No. 57-168525, by K. OOTA, et. al). This voltage level detection circuit may solve the defects of the above mentioned voltage level detection circuit, however, the problem of inaccurate voltage value detection still remains, since the voltage detecting value thereof may vary in response to variations in the manufacturing process parameters, which frequently occur during the production process and have an adverse affect on the detection accuracy.

The above prior art circuits will be explained below in more detail.

SUMMARY OF THE INVENTION

An object of the present invention is to provide a voltage level detection circuit which can accurately detect voltage levels above or below the predetermined level, with a simple circuit and a low power consumption.

According to the present invention, there is provided a voltage level detection circuit connected between first and second feed lines, including a first depletion-type metal insulator semiconductor (MIS) transistor connected between the first feed line and a common node and having a gate connected to the first feed line, a second depletion-type MIS transistor connected between the common node and the second feed line and having a gate connected to the second feed line, and a circuit connected to the common node for generating an output signal when a potential at the common node reaches a predetermined value.

More preferably, the voltage level detection circuit may further comprise a third depletion-type MIS transistor having a drain connected to the drain of the first depletion-type MIS transistor, a source connected to the source of the first depletion-type MIS transistor, and a gate connected to the output terminal of the output signal generation circuit, to output a stabilized output signal at the output terminal of the output signal generation circuit.

BRIEF DESCRIPTION OF THE DRAWINGS

Other objects and features of the present invention will be clearly understood with reference to the accompanying drawings, in which.

DESCRIPTION OF THE PREFERRED EMBODIMENTS

Before describing preferred embodiments of the present invention, an explanation will be given of the prior art with reference to FIGS. 1 and 2.

Figure 1:
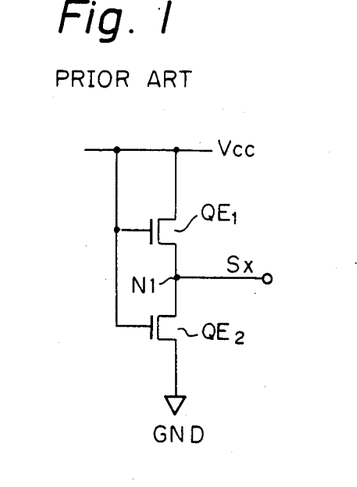
FIG. 1 is a circuit diagram of a prior art voltage level detection circuit.

FIG. 1 shows a circuit diagram of a prior art voltage level detection circuit. In FIG. 1 the voltage level detection circuit consists of two series-connected enhancement-type MOSFETs, $QE_1$ and $QE_2$, provided between a voltage feed line $V_{CC}$ connected to the power supply (not shown) and a ground GND. Reference $V_{CC}$ also indicates a voltage of the power supply. A gate and drain of the MOSFET $QE_1$ and a gate of the MOSFET $QE_2$ are connected to the voltage feed line $V_{CC}$. A source of the MOSFET $QE_1$ and a drain of the MOSFET $QE_2$ are joined at a common node point N1 which is an output terminal. A source of the MOSFET $QE_2$ is connected to the ground GND.

The output level of a logic signal $S_X$ at the node N1 changes in response to the change of the voltage of the power supply $V_{CC}$. If, for example, it is necessary to detect that a voltage difference between the voltage feed line $V_{CC}$ and the ground GND reaches a predetermined value, e.g., 3.0 V (DC), the size of the MOSFETs $QE_1$ and $QE_2$ must be such that the output level of the logic signal $S_X$ exceeds a threshold level of an inverter (not shown) having an input terminal connected to the node N1.

The structure of the voltage level detection circuit is simple, however, as the voltage of the power supply, that is the voltage applied to the gates of the MOSFETs $QE_1$ and $QE_2$ rises, a current passing through the lower stage MOSFET $QE_2$ increases, resulting in a large current consumption in the voltage level detection circuit. In addition, the variation in the range of the voltage change depending on the voltage change in the power supply is small, and thus a highly accurate voltage detection cannot be fully realized.

Figure 2:
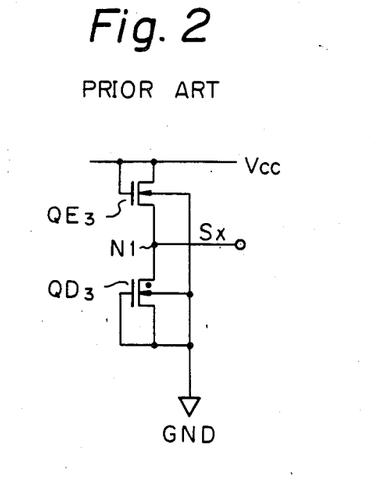
FIG. 2 is a circuit diagram of another prior art voltage level detection circuit.

FIG. 2, shows a circuit diagram of another prior art voltage level detection circuit. In FIG. 2, the voltage level detection circuit consists of a series-connected enhancement-type MOSFET QE$_3$ and depletion type MOSFET QD$_3$ provided between the voltage feed line V$_{CC}$ and the ground GND. A gate and drain of the enhancement-type MOSFET QE$_3$ are connected to the voltage feed line V$_{CC}$, as shown in FIG. 1 and a source of the enhancement-type MOSFET QE$_3$ is joined to a drain of the depletion-type MOSFET QD$_3$ at the node N1. A gate and source of the depletion-type MOSFET QD$_3$ are grounded.

The operation of the voltage level detection circuit shown in FIG. 2 is similar to that of the circuit shown in FIG. 1.

By providing the depletion-type MOSFET QD$_3$ instead of the enhancement-type transistor at a lower stage, a current passing through the transistor QD$_3$ is restricted to a predetermined value, and thus the defect of the large current consumption mentioned above may be solved. The range of the voltage change mentioned above may also be expanded to enable a high accuracy detection of the voltage value. However, the accuracy of the voltage level detection circuit is still adversely affected, depending on variations in the manufacturing process parameters, since two different types of the transistors QE$_3$ and QD$_3$ must be formed in the same circuit. This results in a reduction of the detection accuracy.

Figure 3:
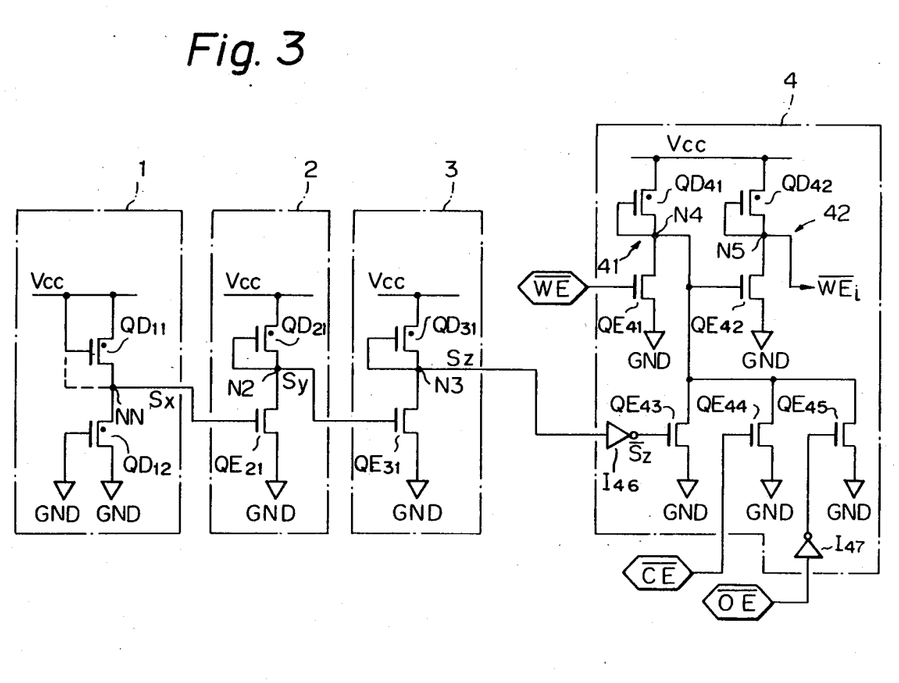
FIG. 3 is a circuit diagram of an embodiment of the voltage level detection circuit in accordance with the present invention.

An embodiment of the present invention will be explained below with reference to FIG. 3. FIG. 3 shows a circuit diagram of a voltage level detection circuit in accordance with the present invention. In the figure, this circuit consists of a first stage voltage level setting circuit 1, second and third stage inverter circuits 2 and 3, and a part of a memory control circuit 4.

The first stage voltage level setting circuit 1 is formed by series-connected depletion-type MIS transistors QD$_{11}$ and QD$_{12}$. A drain of the transistor QD$_{11}$ is connected to the voltage feed line V$_{CC}$, a drain of the transistor QD$_{12}$ is joined to a source of the transistor QD$_{11}$ at a common connected point, i.e., at a node NN, and a gate and source of the transistor QD$_{12}$ are connected to the ground GND.

The first transistor QD$_{11}$ is provided to act as a voltage sensing element. The gate of the transistor QD$_{11}$ can be connected in two ways, i.e., by connecting it to the voltage feed line V$_{CC}$ as shown by a solid line, or by connecting it to the common connected point NN as shown by a dotted line. This will be described later in detail with reference to the explanation of the operation.

The second transistor QD$_{12}$ is provided to function as a constant current source which limits a current flow passing therethrough to a predetermined value.

The second stage inverter circuit 2 consists of a depletion-type MIS transistor QD$_{21}$ acting as a load and having a drain connected to the voltage feed line V$_{CC}$, and an enhancement-type MIS transistor QE$_{21}$ acting as a driver and having a drain joined to a source of the transistor QD$_{21}$ at a common connected node point N2 and a source connected to the ground GND. A gate of the transistor QD$_{21}$ is connected to the common connected node point N2. A gate of the transistor QE$_{21}$ is connected to the common connected node point NN in the first stage voltage level setting circuit 1.

Similarly, the third stage inverter circuit 3 consists of a depletion-type MIS transistor QD$_{31}$ acting as a load and having a drain connected to the voltage feed line V$_{CC}$, and an enhancement-type MIS transistor QE$_{31}$ acting as a driver and having a drain joined to a source of the transistor QD$_{31}$ at a common connected node point N3 and a source connected to the ground GND. A gate of the transistor QD$_{31}$ is connected to the common connected node point N3. A gate of the transistor QE$_{31}$ is connected to the common connected node point N2 in the preceding stage of the inverter circuit 2.

The tandem-connected inverter circuits 2 and 3 act as a signal generation circuit for stabilizing a detection signal S$_X$ sensed in the voltage level setting circuit 1 as well as a circuit for recovering the signal level of an output signal S$_Z$ to that of the input signal S$_X$.

The circuit 4 in FIG. 3 is a part of the memory control circuit which is made operable by the output signal S$_Z$ from the inverter circuit 3. The circuit 4 is formed by tandem-connected inverter circuits 41 and 42 each consisting of series-connected depletion-type MIS transistors QD$_{41}$:QD$_{42}$ and enhancement-type MIS transistors QE$_{41}$:QE$_{42}$. The circuit construction of these inverter circuits 41 and 42 is similar to that of the inverter circuits 2 or 3 mentioned above. The circuit 4 further includes three parallel-connected enhancement-type MIS transistors QE$_{43}$, QE$_{44}$, and QE$_{45}$ in which the drain of each is connected to a common connected node point N4 in the inverter circuit 41 and the source is connected to the ground GND. The circuit 4 includes inverters I$_{46}$ and I$_{47}$ similar to the inverter circuit 3.

In a normal operation mode, when an external write enable signal $\overline{WE}$ is applied to a gate of the transistor QE$_{41}$, an internal write enable signal $\overline{WE}_i$ may be output at a node N5. In a start-up mode of the power supply, when the voltage value of the power supply reaches a predetermined value, for example, 3 V(DC), the output signal S$_Z$ applied to the gate of the transistor QE$_{43}$ through the inverter I$^{46}$ may turn the transistor QE$_{43}$ off to generate the internal write enable signal $\overline{WE}_i$ having a significant logic level, so that the memory circuit may be brought into a stable operation mode.

Similarly, a chip enable signal $\overline{CE}$ is applied to the gate of the transistor QE$_{44}$. An output enable signal $\overline{OE}$ is also applied to the gate of the transistor QE$_{45}$ through the inverter I$_{47}$.

The operation of the circuit arrangement shown in FIG. 3 will be explained.

Figure 4:
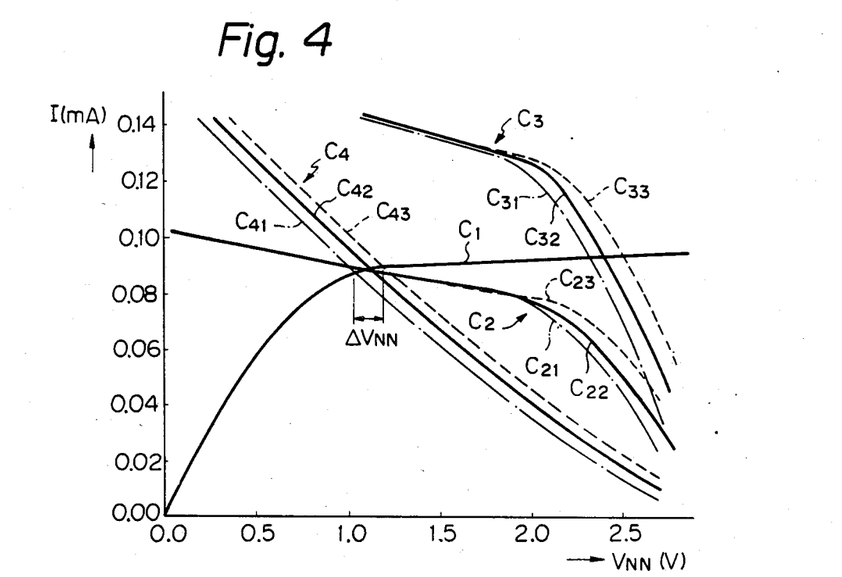
FIGS. 4 and 5 are graphs for explaining the operation of the circuit shown in FIG. 3.

FIG. 4 is a graph showing the characteristic of the voltage level setting circuit 1. In FIG. 4, the abscissa indicates the voltage V$_{NN}$(volt) at the node NN and the ordinate indicates the current I(mA) passing through the transistor QD$_{11}$ or QD$_{12}$.

First, the operation will be explained when the gate of the transistor QD$_{11}$ in the voltage level setting circuit 1 is connected to the node NN as shown by the dotted line.

Based on the parameters of the channel width to length ratio (W/L) of the transistor QD$_{11}$ being 7.54/4 and the W/L of the transistor QD$_{12}$ being 7/4, the characteristic curves C$_1$ and C$_2$, the latter consisting of C$_{21}$, C$_{22}$, and C$_{23}$, were obtained. The curve C$_1$ indicates a current passing through the transistor QD$_{12}$. Because of the voltage rise at the node NN, V$_{NN}$, which increases in response to the voltage rise at the voltage feed line V$_{CC}$, the current iQD$_{12}$ also increases to approximately 0.092 mA at 1.25 V of the voltage V$_{NN}$. After that, the current iQD$_{12}$ may be substantially saturated unless the voltage V$_{NN}$ continues to increase. Thus, the transistor QD$_{12}$ acts as the constant current source and limits the power consumption to the low level.

The curve C$_2$ indicates a current passing through the transistor QD$_{11}$, iQD$_{11}$, which is defined by the voltage $V_{CC}$ on the voltage feed line. The curve $C_{21}$ shown by a dash-dot line indicates the current $iQD_{11}$ when the voltage $V_{CC}$ is 2.9 V, the curve $C_{22}$ shown by a solid line indicates the current $iQD_{11}$ when the voltage $V_{CC}$ is 3.0 V, and the curve $C_{23}$ shown by a broken line indicates the current $iQD_{11}$ when the voltage $V_{CC}$ is 3.1 V.

The point where the curves $C_1$ and $C_2$ cross defines the voltage $V_{NN}$ of the detection signal $S_X$. In this case, the voltage $V_{NN}$ is approximately 1.1 V. This voltage level is preferable when triggering the inverter circuit 2, so that a stable output signal $S_Z$ can be applied to the gate of the transistor $QE_{43}$ through the inverter $I_{46}$.

In the embodiment, however, there appears the following disadvantages: (1) the change of the voltage $V_{NN}$ may be affected depending on the change of the manufacturing process parameters, since the characteristic curves $C_1$ and $C_2$ intersect at an acute angle; and (2), the voltage detection may be inaccurate, because the respective curves $C_{21}$, $C_{22}$ and $C_{23}$ are integrated with the curves $C_2$ at the cross-point on the curve $C_1$, and thus the voltage level setting circuit 1 may respond in the same way within the range of the voltage $V_{CC}$ of 2.9 V and 3.1 V.

In this regard, an inventor of the present invention attempted to use a different process parameter, that is a W/L ratio of the transistor $QD_{11}$ of 12/4. However, the W/L ratio of the transistor $QD_{12}=7/4$ was maintained as mentioned above, and the characteristic curves $C_1$ and $C_3$ consisting of curves $C_{31}$, $C_{32}$, and $C_{33}$ are obtained. The curve $C_1$ is identical to that mentioned above. The curve $C_{31}$ shown by a dash-dot line indicates the current $iQD_{11}$ passing through the transistor $QD_{11}$ when the voltage $V_{CC}$ is 2.9 V. Similarly, the curve $C_{32}$ shown by a solid line and the curve $C_{33}$ shown by a broken line indicate the current $iQD_{11}$ when the voltage $V_{CC}$ is respectively 3.0 V and 3.1 V.

This embodiment solves the disadvantages mentioned above, as can be seen from the crossing-relationship of the curves $C_1$ and $C_{31}$, $C_{32}$, and $C_{33}$. The embodiment, however, has a disadvantage of having a considerably high level sensing voltage $V_{NN}$ of between approximately 2.3 V and 2.5 V. Normally, the trip level of the inverter circuit 2 is between approximately 1.0 V and 1.5 V. Accordingly, such a high level sensing voltage is not compatible with the requirements of the inverter circuit 2. In order to realize the signal generation circuit instead of the inverter circuit 2 meeting the above high level voltage, more complex circuits, for example, a Schmitt trigger circuit must be provided. Even if the Schmitt trigger circuit is applied for the signal generation circuit, it would be difficult to realize a trip level of 2.0 V to 2.5 V when the voltage $V_{CC}$ is 3 V. Furthermore, the trip level would be varied depending on the change of the process parameters, leading to inaccuracies in the detection level.

A preferred embodiment will be described immediately below. Here, the inventor devised the voltage level setting circuit 1 wherein the gate of the transistor $QD_{11}$ is connected to the voltage feed line $V_{CC}$, as shown by a solid line, instead of to the common connected point NN.

Based on the following parameters of the W/L of the transistor $QD_{11}$ being 4/8 and the W/L of the transistor $QD_{12}$ being 7/4 the, characteristic curves $C_1$ and $C_4$, the latter consisting of curves $C_{41}$, $C_{42}$, and $C_{43}$, were obtained. The curve $C_1$ is identical to that mentioned above, because the process parameter W/L of the transistor $QD_{12}$ is the same.

The curve $C_{41}$ indicates the current $iQD_{11}$ passing through the transistor $QD_{11}$ when the voltage $V_{CC}$ is 2.9 V. Similarly, the curves $C_{42}$ and $C_{43}$ indicate the current $iQD_{11}$ when the voltage $V_{CC}$ is 3.0 V and 3.1 V.

The voltages $V_{NN}$ at cross-points of the curve $C_1$ and the curve $C_{41}$, $C_{42}$ and $C_{43}$ are, respectively, approximately 1.03 V, 1.12 V, and 1.21 V. The range of the voltage $\Delta V_{NN}$ is 0.18 V, i.e., $\pm 0.09$ V of the center voltage $V_{NN}$.

The value of the voltage $V_{NN}$ meets the requirement for triggering the inverter circuit 2. In addition, the voltage range $\Delta V_{NN}$ is sufficient to discriminate the change of the voltage $V_{CC}$ at a resolution of 0.1 V.

The operation of the circuit shown in FIG. 3 will be explained.

Figure 5:
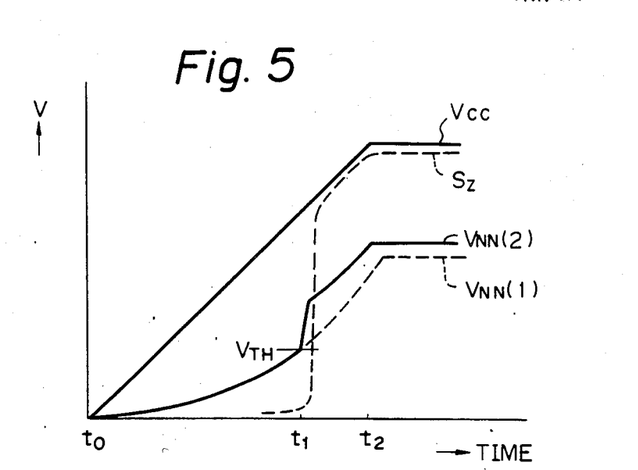

FIG. 5 is a graph illustrating voltage changes of the signals $V_{CC}$, $S_X$, and $V_{NN}$ (1) over a period of time.

In this embodiment, in order to simplify the description, it is assumed that the voltage $V_{CC}$ of the power supply rises linearly from the time $t_0$ to the time $t_2$. The value of the voltage $V_{CC}$ is zero volt at the time $t_0$ and 5 V at the time $t_2$.

As the voltage $V_{CC}$ of the power supply begins to rise at the time $t_0$, the transistor $QD_{11}$ may operate to begin flowing the current $iQD_{11}$ passing between the drain and the source thereof. The current $iQD_{11}$ flows in the ground GND through the transistor $QD_{12}$ which acts as the constant current source. The rise of the voltage $V_{CC}$ of the power supply causes the current $iQD_{11}$ to increase, however, the transistor $QD_{12}$ limits the current $iQD_{12}$ passing therethrough. Accordingly, the rise of the voltage $V_{NN}$ (1) shown by a broken line in FIG. 5 at the node NN depends on the rising of the voltage $V_{CC}$. When the voltage $V_{NN}$ (1) exceeds a threshold voltage $V_{TH}$ of the inverter circuit 2, an output level of the output signal $S_Y$ is inverted; in other words, the voltage level at the node N2 becomes low at the time $t_1$.

When the inverted output signal $S_Y$ is applied to the gate of the transistor $QE_{31}$ in the inverter circuit 3, an output level of the output signal $S_Z$ at the node N3 is inverted from a low to a high level. As a result, the output signal $S_Z$ having a high level is applied to the gate of the transistor $QE_{43}$ through the inverter $I_{46}$, so that the internal write enable signal $\overline{WE}_i$ is generated to trigger the memory circuit.

As the transistor $QD_{12}$ acts as the constant current source limiting the current flowing to the ground, the power consumption in the voltage level setting circuit 1 is restricted to a predetermined value. In addition, since the source of the transistor $QD_{12}$ is grounded, there is no affect from back-bias, which ensures a stabilized circuit operation.

Figure 6:
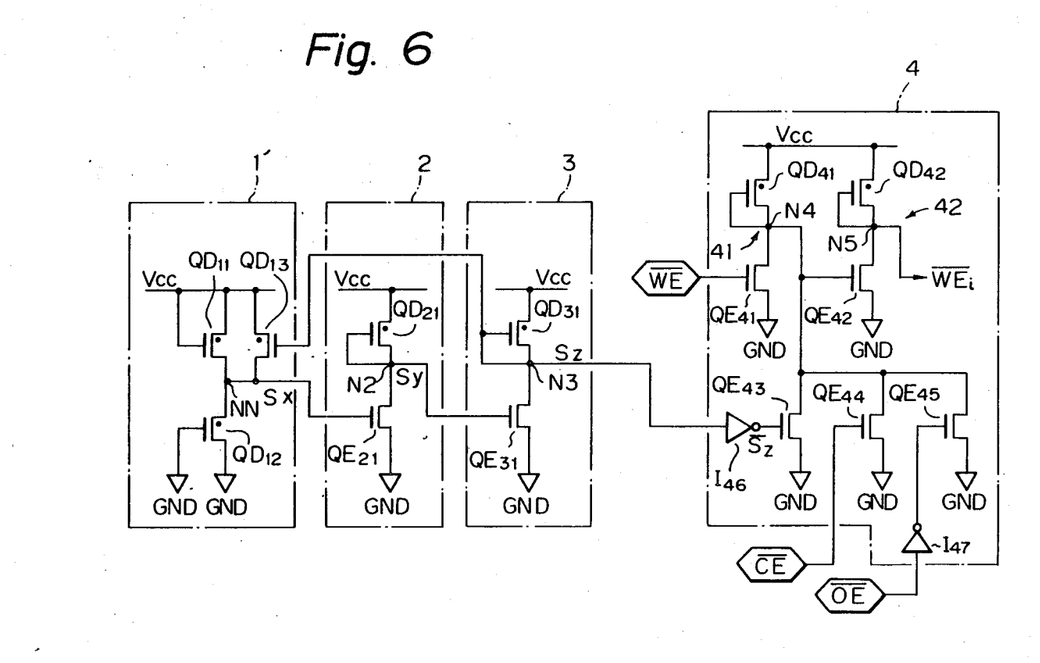
FIG. 6 is a circuit diagram of another embodiment of the voltage level detection circuit in accordance with the present invention.

FIG. 6 is a circuit diagram of another embodiment of the present invention. In FIG. 6, a voltage level setting circuit 1' includes a third depletion-type MIS transistor $QD_{13}$. Other elements in FIG. 6 are identical to those in FIG. 3 and bear the same references.

The transistor $QD_{13}$ is connected to the transistor $QD_{11}$ in parallel. That is, a drain and source of the transistor $QD_{13}$ are connected to those of the transistor $QD_{11}$. A gate of the transistor $QD_{13}$, however, is connected to the node N3 in the inverter circuit 3. In other words, the output signal $S_Z$ is applied to the gate of the transistor $QD_{13}$ as a feedback signal.

After the voltage of the power supply is detected as reaching a predetermined value, for example, 3.0 V, the high level output signal $S_Z$ is applied to the gate of the transistor $QD_{13}$, and thus the transistor $QD_{13}$ may be rendered operative. As this increases the mutual conductance gm of the transistor $QD_{13}$, the voltage $V_{NN}$ (2) shown by a solid line in FIG. 5, at the node NN may be abruptly pulled up to the voltage $V_{CC}$. Consequently, the buffer circuit or the signal generation circuit consisting of the inverter circuits 2 and 3 latches the detection signal $S_X$ to output the stable output signal $S_Z$.

Figure 7:
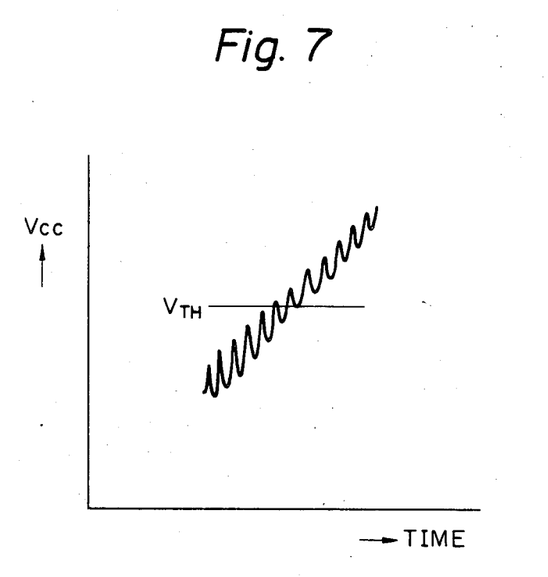
FIG. 7 is a graph for explaining the operation of the circuit shown in FIG. 6.

This is an advantage in that it will prevent oscillation of the inverter circuit 3, particularly when, at the power supply start-up, the voltage $V_{CC}$ contains fluctuations or noise as shown in FIG. 7.

If the transistor $QD_{13}$ is omitted, the output signal $S_Z$ would be high or low, depending on the fluctuation of the voltage $V_{CC}$ in the vicinity of the threshold level $V_{TH}$. By providing the transistor $QD_{13}$, the oscillation may be eliminated to ensure that the output of the output signal $S_Z$ is stable.

After the voltage $V_{NN}$(2) at the node NN is abruptly raised by the pull-up motion of the transistor $QD_{13}$, the current feeding abilities of the transistors $QD_{11}$ and $QD_{13}$ are increased. In other words, the resistances of the transistors $QD_{11}$ and $QD_{13}$ are reduced in proportion to the increase of the voltage $V_{CC}$ of the power supply. As a result, the voltage $V_{NN}$ (2) may be increased to become approximately proportional to the increase of the voltage $V_{CC}$, and then may remain at a constant level when the voltage $V_{CC}$ reaches the rated value at the time $t_2$ in FIG. 5.

The above explanation of operation concerns detection of the rising voltage $V_{CC}$ at power supply start-up. The voltage level detection circuit naturally detects the falling voltage $V_{CC}$ when, for example, the power supply fails or stops, or a change of the voltage $V_{CC}$ occurs because of noise.

In the embodiments shown in FIGS. 3 and 6, the detection level of the voltage at the node NN can be determined with reference to the desired detection voltage level meeting the operation condition of the application circuit, and the threshold voltage $V_{TH}$ of the inverter circuit 2, and defines the size of the transistors $QD_{11}$ to $QD_{13}$. More specifically, when the desired detection voltage $V_{CC}$ is 3.0 V and the threshold voltage $V_{TH}$ of the inverter circuit is 1.5 V, the detection voltage at the node NN is designed to be 1.5 V. The dimensions of each of the transistors $QD_{11}$ and $QD_{12}$, for example, the channel width and length of the transistor, are designed to meet the above requirement.

The transistors $QD_{11}$ to $QD_{13}$ in the voltage level setting circuit 1 and 1' are depletion-type MIS transistors. Accordingly, even though the circuit parameters may be varied due to changes in the manufacturing process, the circuit parameters in each transistor may be uniformly varied to obtain relatively uniform circuit parameters between the transistors $QD_{11}$, $QD_{12}$, and $QD_{13}$, so that a high accuracy of voltage detection can be maintained.

Any desired number of steps of inverter circuits following the voltage level setting circuit 1 can be used to enable the output of a low-level and/or high-level detection signal.

For example, the inverter circuits 2 and 3 shown in FIGS. 3 and 6 can be replaced by complementary MIS (C-MIS) inverter circuits.

Many widely different embodiments of the present invention may be constructed without departing from the spirit and scope of the present invention. It should be understood that the present invention is not limited to the specific embodiments described in this specification, except as defined in the appended claims.

I claim:

1. A voltage level detection circuit connected between first and second feed lines, comprising:
    a first depletion-type metal insulator semiconductor (MIS) transistor, connected between said first feed line and a common node, having a gate connected to said first feed line, having a source and having a drain, the source and drain forming source-drain current path between said common node and said first feed line;
    a second depletion-type MIS transistor, connected between said common node and said second feed line, having a gate connected to said second feed line, having a source and having a drain, the source and drain forming a source-drain current path between said common node and said second feed line;
    output signal generation means, connected to said common node, for generating at an output terminal thereof an output signal when the potential at said common node reaches a predetermiend value, said output signal generation means including:
        a first inverter circuit having an input terminal connected to said common node and having an output terminal; and
        a second inverter circuit having an input terminal connected to said output terminal of said first inverter circuit; and
    a third depletion-type MIS transistor having a drain connected to the drain of said first depletion-type MIS transistor, having a source connected to the source of said first depletion-type MIS transistor, and having a gate connected to said output terminal of said output signal generation means, for stabilizing said output signal at said output terminal of said output signal generation means.

2. A voltage level detection circuit according to claim 1, wherein said first and second inverter circuits have a predetermined threshold voltage, outputting a logic signal corresponding to said output signal.

3. A voltage level detection circuit according to claim 2, wherein said first and second inverter circuits each include a depletion-type transistor and an enhancement-type transistor connected in series.

4. A voltage level detection circuit according to claim 1, wherein each of said inverter circuits includes a depletion-type transistor and an enhancement-type transistor connected in series.

5. A voltage level detection circuit according to claim 1, wherein the value of said output signal of said output signal generation means is lower than said predetermined value of said potential at said common node.

6. A voltage level detection circuit according to claim 5, wherein said first and second inverter circuits have a predetermined threshold voltage, outputting a logic signal corresponding to said output signal.

7. A voltage level detection circuit according to claim 6, wherein said first and second inverter circuits each include a depletion-type transistor and an enhancement-type transistor connected in series.

8. A voltage level detection circuit according to claim 1, wherein said first feed line is connected to a direct current (DC) power source and said second feed line is connected to ground.

9. A voltage level detection circuit according to claim 8, wherein said DC power source is rated at 5 V and said predetermined value for the voltage at said common node is approximately 3 V.

10. A voltage level detection circuit connected between first and second feed lines, comprising:

a first depletion-type metal insulator semiconductor (MIS) transistor having a source and having a drain, the source and drain connected between the first feed line and a common node, and having a gate connected to a predetermmined one of the first feed line and said common node;

a second depletion-type MIS transistor having a source and having a drain connected between said common node and the second feed line and having a gate connected to the second feed line;

output signal generating means having an output terminal, operatively connected to said common node, for generating an output signal at the output terminal when the potential at said common node reaches a predetermined value; and a third depletion-type MIS transistor having a drain connected to the drain of said first depletion-type MIS transistor, having a source connected to the source of said first depletion-type MIS transistor, and having a gate connected to the output terminal of said output signal generating means, for stabilizing said output signal at the output terminal of said output signal generating means.

11. A voltage level detection circuit according to claim 10, wherein said output signal generating means includes an inverter circuit having a predetermined threshold voltage for outputting a logic signal corresponding to said output signal.

12. A voltage level detection circuit according to claim 11, wherein said inverter circuit comprises:

a depletion-type transistor; and an enhancement type transistor operatively connected in series with said depletion-type transistor.

* * * * *

UNITED STATES PATENT AND TRADEMARK OFFICE
CERTIFICATE OF CORRECTION

PATENT NO. : 4,682,051

DATED : JULY 21, 1987

INVENTOR(S) : HIDEKI ARAKAWA

It is certified that error appears in the above-identified patent and that said Letters Patent is hereby corrected as shown below:

Col. 4, line 34, "$I^{46}$" should be --$I_{46}$--.

Signed and Sealed this

Fifth Day of January, 1988

*Attest:*

DONALD J. QUIGG

*Attesting Officer*   *Commissioner of Patents and Trademarks*